(12) United States Patent
Crowder

(10) Patent No.: US 8,153,482 B2
(45) Date of Patent: Apr. 10, 2012

(54) WELL-STRUCTURE ANTI-PUNCH-THROUGH MICROWIRE DEVICE

(75) Inventor: Mark Albert Crowder, Portland, OR (US)

(73) Assignee: Sharp Laboratories of America, Inc., Camas, WA (US)

( * ) Notice: Subject to any disclaimer, the term of this patent is extended or adjusted under 35 U.S.C. 154(b) by 709 days.

(21) Appl. No.: 12/235,359

(22) Filed: Sep. 22, 2008

(65) Prior Publication Data
US 2010/0072455 A1    Mar. 25, 2010

(51) Int. Cl.
*H01L 21/335* (2006.01)
(52) U.S. Cl. .......................... 438/142; 977/936
(58) Field of Classification Search ............... 438/142; 977/936
See application file for complete search history.

(56) References Cited

U.S. PATENT DOCUMENTS

| | | |
|---|---|---|
| 3,346,414 A | 10/1967 | Ellis et al. |
| 3,493,431 A | 2/1970 | Wagner et al. |
| 3,505,127 A | 4/1970 | Arthhur, Jr. et al. |
| 3,573,967 A | 4/1971 | Pfrann et al. |
| 5,561,308 A * | 10/1996 | Kamata et al. ............... 257/301 |
| 5,858,862 A | 1/1999 | Westwater et al. |
| 6,768,166 B2 * | 7/2004 | Hagemeyer ................. 257/324 |
| 7,211,464 B2 | 5/2007 | Lieber et |
| 2005/0136585 A1* | 6/2005 | Chau et al. ................... 438/214 |
| 2006/0175601 A1* | 8/2006 | Lieber et al. ................... 257/19 |
| 2007/0017439 A1* | 1/2007 | Xianyu et al. ................ 117/108 |
| 2009/0057650 A1* | 3/2009 | Lieber et al. ................... 257/24 |

FOREIGN PATENT DOCUMENTS

| | | |
|---|---|---|
| JP | 1307268 | 12/1989 |
| JP | 3209876 | 9/1991 |
| JP | 2004296628 | 10/2004 |
| JP | 2005101278 | 4/2005 |
| JP | 2005197612 | 7/2005 |

* cited by examiner

*Primary Examiner* — Douglas Menz
(74) *Attorney, Agent, or Firm* — Law Office of Gerald Maliszewski; Gerald Maliszewski

(57) ABSTRACT

A well-structure anti-punch-through microwire device and associated fabrication method are provided. The method initially forms a microwire with alternating highly and lightly doped cylindrical regions. A channel ring is formed external to the microwire outer shell and surrounding a first dopant well-structure region in the microwire, between source and drain (S/D) regions of the microwire. The S/D regions are doped with a second dopant, opposite to the first dopant. A gate dielectric ring is formed surrounding the channel ring, and a gate electrode ring is formed surrounding the gate dielectric ring. The well-structure, in contrast to conventional micro or nanowire transistors, helps prevent the punch-through phenomena.

13 Claims, 7 Drawing Sheets

WELL-STRUCTURE ANTI-PUNCH-THROUGH MICROWIRE DEVICE

BACKGROUND OF THE INVENTION

1. Field of the Invention

This invention generally relates to integrated circuit (IC) fabrication and, more particularly, to a well-structure microwire transistor device.

2. Description of the Related Art

As-grown, in-situ end-doped core-shell-shell (ECSS) nanowires are known for use in the fabrication of transistor devices. However, there are several problems associated with these wires, such as the ability to control the dopant concentration and width of the intrinsic channel, poor wire diameter and length uniformity, and harvesting of the nanowires (NWs) for dispersion onto a larger substrate.

The NW wire diameter can affect the depth of the depletion layer within the transistor channel, and poor uniformity can cause some wires to be fully depleted, with adjacent wires only partially depleted. This is especially problematic for the control of threshold voltage distribution.

It would be advantageous if the performance of NW transistor devices could be made more uniform.

SUMMARY OF THE INVENTION

A microwire architecture is disclosed herein that permits the use of larger diameter wires having a fully-doped, modulated P-N-P, or N-P-N structure with an intrinsic epitaxial Si shell for NMOS or PMOS transistor applications. The use of larger diameters ($d_{wire}$>500 nm) is desirable for a number of reasons. First, growth conditions are more favorable for larger diameter wires—providing a higher yield and greater uniformity. The use of an epitaxial intrinsic Si layer permits a finer control of the depletion region, so the devices can become fully depleted, enabling better control of the device parameters (e.g., threshold voltage) and uniformity. The modulated doping transient lengths (i.e., the growth length between when the source/drain dopant is on and off) have less impact on the overall device performance. The use of an epitaxial Si layer for the channel also permits precise threshold voltage adjustments to be made independent of the modulated growth process.

Further, the effective channel width scales with the diameter, so that a 1 μm microwire has a channel width 10 times that of conventional nanowires with a typical diameter of approximately 100 nanometers (nm). Larger channel widths permit higher $I_{on}$ per wire and reduce the need for multiple wires to be deposited per device.

Accordingly, a method is provided for fabricating a well-structure anti-punch-through microwire device. The method initially forms a microwire with alternating highly and lightly doped cylindrical regions. A channel ring is formed surrounding a first dopant well-structure region in the microwire, between source and drain (S/D) regions of the microwire. The S/D regions are doped with a second dopant, opposite to the first dopant. A gate dielectric ring is formed surrounding the channel ring, and a gate electrode ring is formed surrounding the gate dielectric ring. The well-structure, in contrast to conventional micro or nanowire transistors, helps prevent the punch-through phenomena. In one aspect, the channel ring is formed external to the microwire outer shell wall.

The microwire is formed by depositing a nucleation catalyst on a substrate. A silane precursor and the first dopant are introduced. As the microwire is grown, the introduction of the second dopant is pulse modulated. In another aspect, the introduction of both the first and second dopant is pulse modulated. For example, when the first dopant is introduced, the flow of the second dopant is stopped, and when the second dopant is introduced, the flow of the first dopant is interrupted. After removing the catalyst, an intrinsic Si layer is epitaxially grown surrounding the microwire, which may be used to form the channel ring. The intrinsic Si is oxidized to form the gate dielectric ring surrounding the channel ring. Then, a gate electrode material is deposited overlying the oxidized intrinsic Si, and the gate electrode material, oxidized intrinsic Si, and intrinsic Si layer surrounding the source and drain regions are selectively etched away.

Additional details of the above-described method and well-structure anti-punch-through microwire device are presented below.

DETAILED DESCRIPTION

Figure 1A:
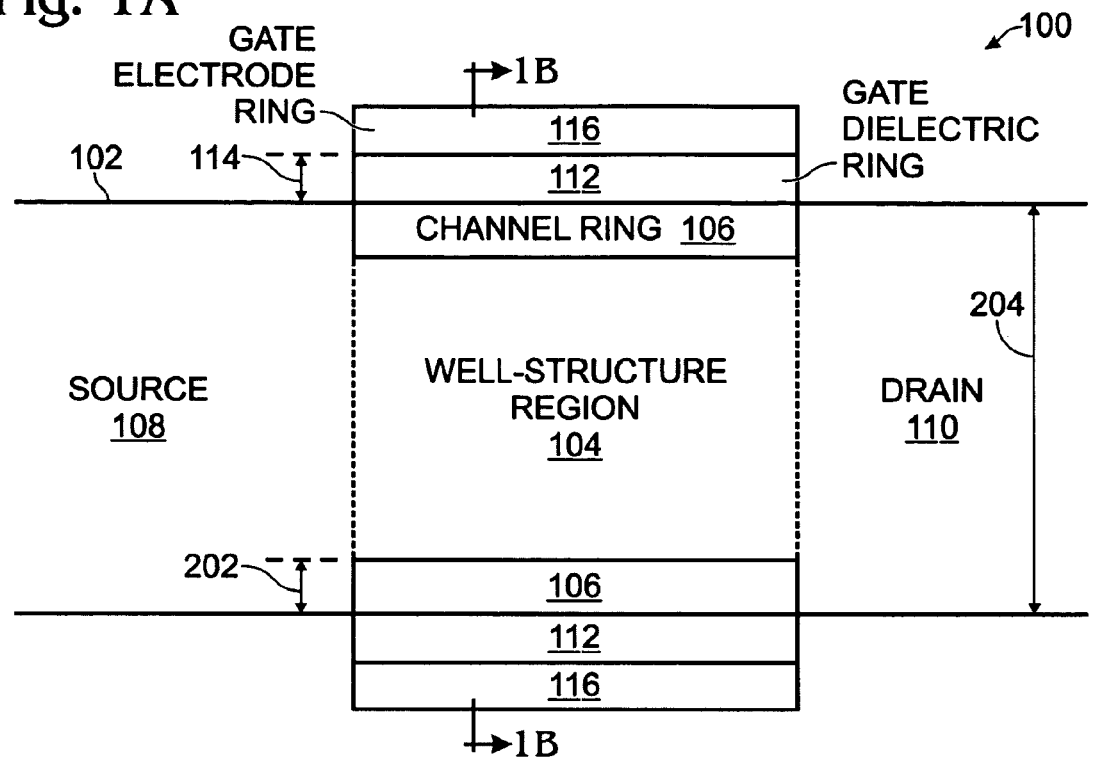
FIGS. 1A and 1B are partial cross-sectional views of a well-structure anti-punch-through microwire device.
Figure 1B:
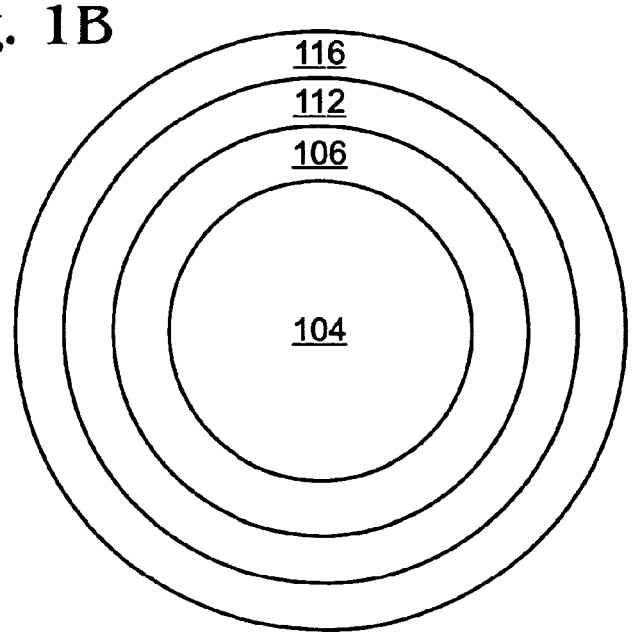

FIGS. 1A and 1B are partial cross-sectional views of a well-structure anti-punch-through microwire device. The device 100 comprises a microwire 102 with alternating highly and lightly doped cylindrical regions, including a first dopant well-structure region 104. A channel ring 106 surrounds the well-structure region 104, between source 108 and drain 110 regions of the microwire. The source and drain (S/D) regions 108/110 are doped with a second dopant, opposite to the first dopant. For example, the first dopant may be n-type and the second dopant p-type. Alternately, the first dopant may be p-type and first dopant n-type. Thus, the microwire alternating highly and lightly doped cylindrical regions are either an NPN or PNP sequence.

A gate dielectric ring 112 overlies the channel ring 106. Typically, the gate dielectric ring 112 has a ring thickness 114 in the range of 10 to 60 nm. A gate electrode ring 116 overlies the gate dielectric ring 112.

Figure 2A:
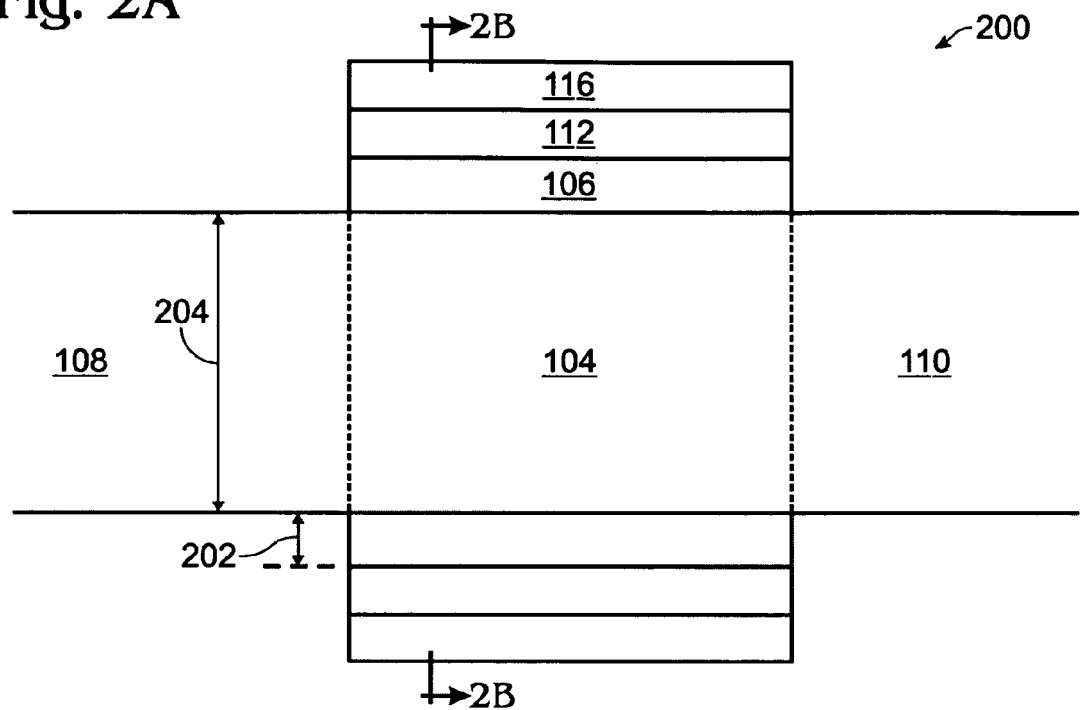
FIGS. 2A and 2B are partial cross-sectional views of a first variation of the well-structure anti-punch-through microwire device of FIGS. 1A and 1B.
Figure 2B:
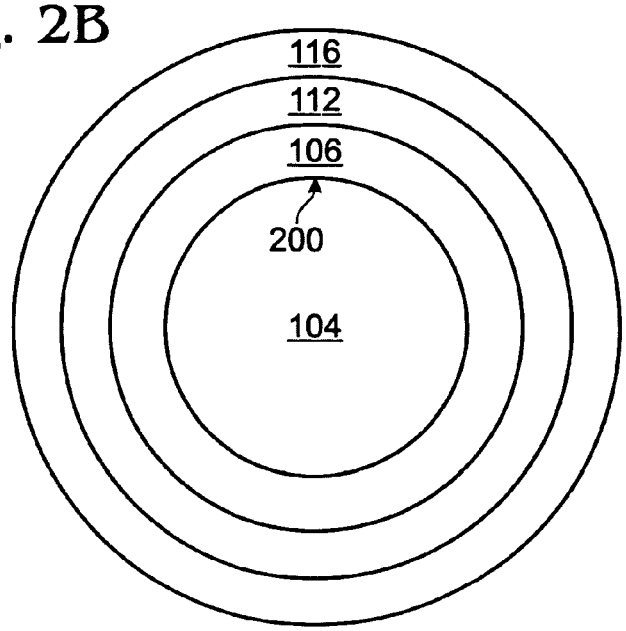

FIGS. 2A and 2B are partial cross-sectional views of a first variation of the well-structure anti-punch-through microwire device of FIGS. 1A and 1B. The microwire 102 has an outer shell wall 200, and the channel ring 106 is formed external to the microwire outer shell wall 200.

Referencing any of the above-mentioned figures, the channel ring 106 is formed from an intrinsic or lightly doped silicon (Si) layer having a dopant concentration of less than about $2\times10^{16}$ per cubic centimeter ($cm^{-3}$). In contrast, the well-structure region 104 has a first dopant concentration of greater than about $5\times10^{16}$ $cm^{-3}$, underlying the channel layer 106. Whether the channel ring 106 is formed internal or external to the microwire 102, the channel ring 106 has a ring thickness 202 in the range of 30 to 90 nm.

In one aspect, the microwire 102 has a diameter 204 of greater than 500 nanometers (nm). However, the above-described structure can also be enabled using smaller microwires having a diameter of greater than 50 nm. The microwire 102 may also be referred to as a nanowire.

Functional Description

Figure 3:
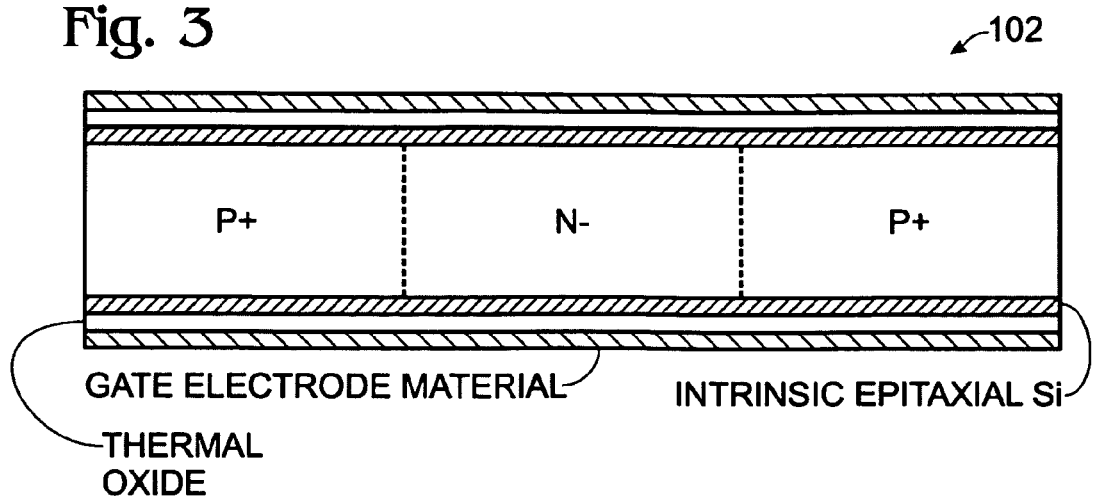
FIGS. 3 through 5 are partial cross-sectional views depicting steps in the fabrication of a completed well-structure microwire device.
Figure 4:
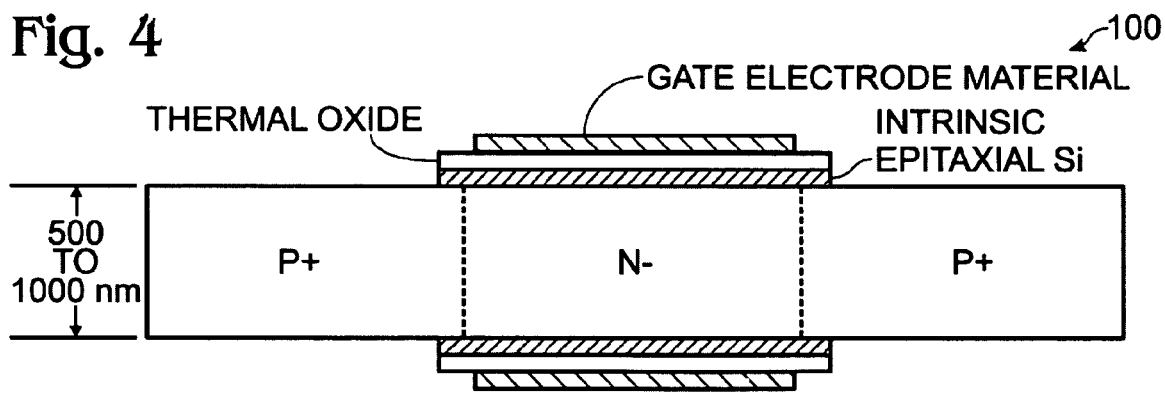
Figure 5:
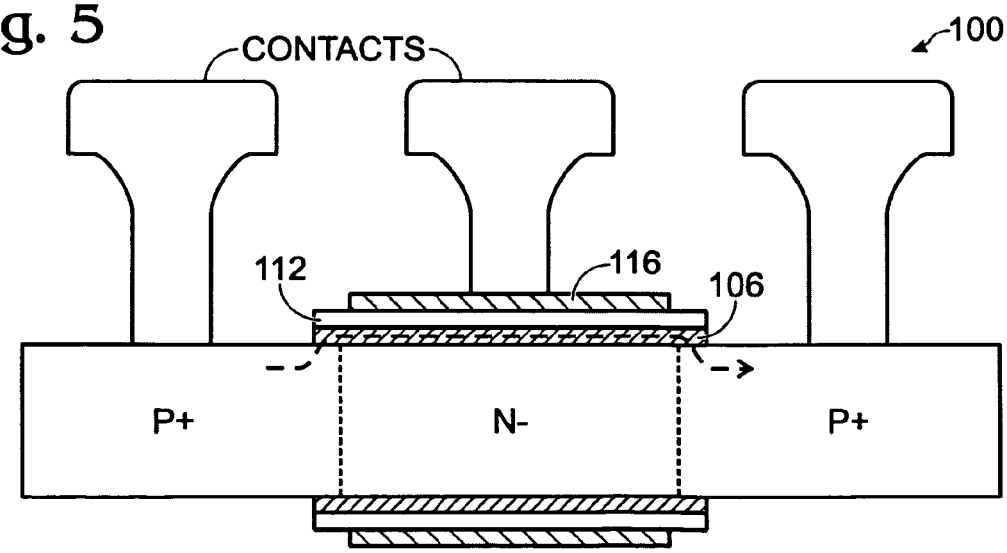

FIGS. 3 through 5 are partial cross-sectional views depicting steps in the fabrication of a completed well-structure microwire device. The microwires are grown (e.g., for PMOS devices) with modulated doping that defines highly-doped $P^+$ source and drain regions, and a moderately-doped $N^-$ "well" region that defines the device channel length. The $N^-$ doping can be constantly on for the entire growth cycle, with the $P^+$ doping being turned on and off (see FIG. 6).

After microwire growth, the catalyst material is removed and an intrinsic Si shell is epitaxially grown on the surface of the microwire, see FIG. 3. The layer thickness can be precisely controlled, thereby allowing full depletion of the channel region when the device is turned on. The intrinsic region can be oxidized using a variety of means, including wet or dry thermal oxidation, HDP oxidation, or depositing a CVD-based oxide. This oxide forms the gate insulator shell for the transistor device.

FIG. 4 depicts the device of FIG. 3 after etching of the outer shells (gate material, gate insulator, and intrinsic epi-Si). The wire diameter is shown to be greater than 500 nm is this example.

FIG. 5 depicts the final device configuration with electrode contacts. The current path is indicated by dashed line. A PMOS device architecture is shown in this example. An NMOS device would require an $N^+$-$P^-$-$N^+$ doping profile. The highly doped $P^+$ regions are contacted as the source and drain, while the intrinsic Si shell acts as the channel, and the $N^-$ region acts as an effective well between the source and drain (i.e., to prevent back-side conductance/leakage). The various shell layers can be etched using an end-in etch process. In particular, the outer shell gate electrode can be etched using this scheme through the contact holes. The channel length is controlled by the length of the $N^-$ well, as the intrinsic Si directly in contact with the P+ regions will likely experience some diffusion of dopant material during various high-temperature processing steps (e.g., oxidation).

Figure 6:
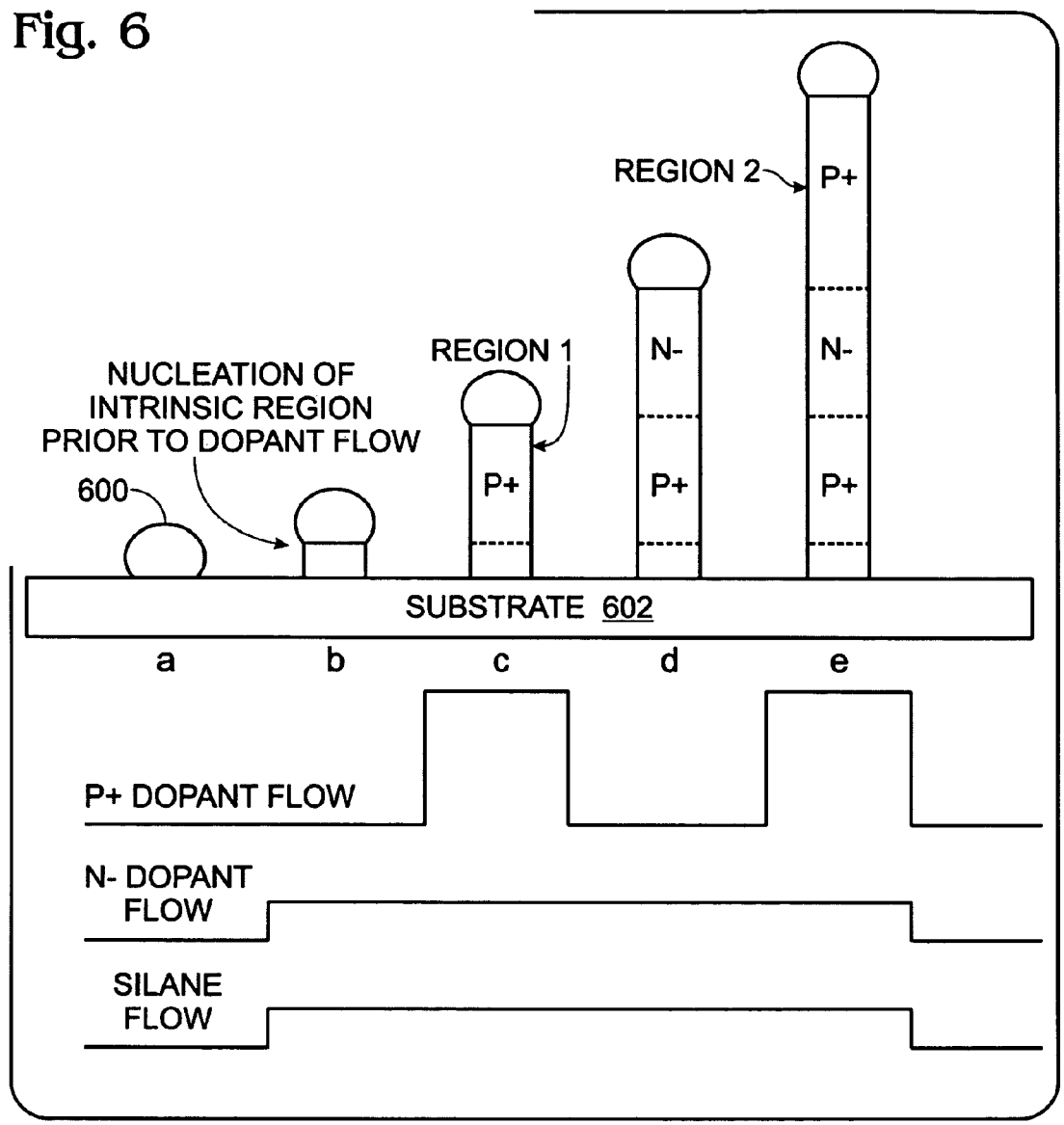
FIG. 6 is a diagram depicting a silicon microwire growth process using a vapor-liquid-solid (VLS) approach.

FIG. 6 is a diagram depicting a silicon microwire growth process using a vapor-liquid-solid (VLS) approach. Catalyst balls 600 are formed on a 111 Si substrate 602. $N^-$-doped silane flows at appropriate growth conditions (temperature and pressure controlled) causing nucleation of an intrinsic Si microwire. The nucleation step can also be accomplished with intrinsic Si, followed by the addition of the N− dopant gas for the remainder of the growth. $P^+$ dopant gas is turned on, providing heavily-doped source/drain region 1. The $P^+$ dopant is stopped, providing lightly-doped $N^-$ "well" region. The $P^+$ dopant is restarted for source/drain region 2. After sufficient growth, all gases are stopped and growth is terminated.

Figure 7:
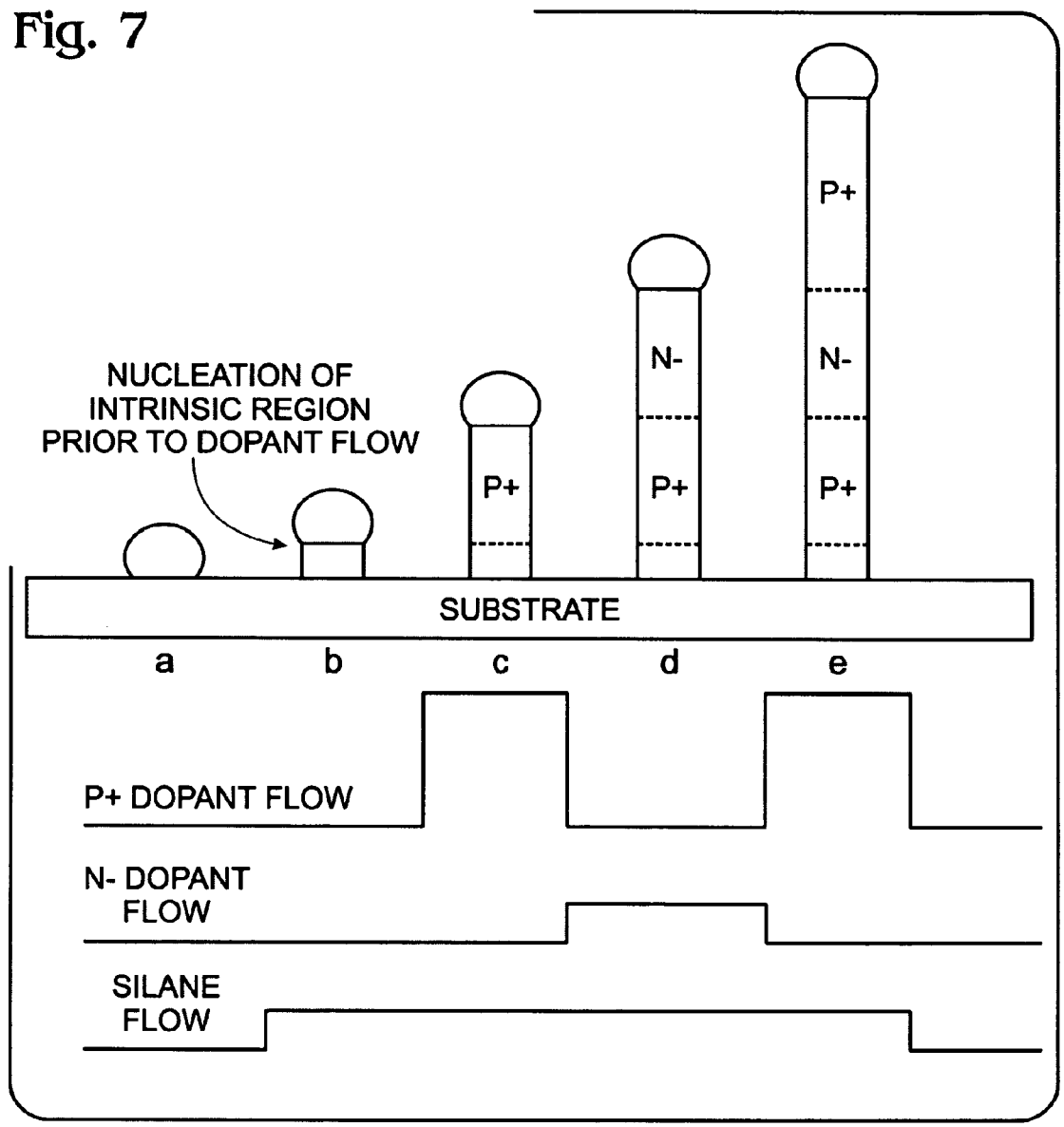
FIG. 7 is a diagram depicting a VLS Si microwire growth process using an alternate doping technique.

FIG. 7 is a diagram depicting a VLS Si microwire growth process using an alternate doping technique. As shown, both the $P^+$ and $N^-$ are both pulse modulated. In this example, the modulation is complementary, however, in other aspects not shown, there may be periods of overlap when both the $P^+$ and $N^-$ dopant flow, or when neither the $P^+$ or $N^-$ dopant flow.

Although a VLS process is described, it should be understood that the microwires may be fabricated using other techniques, which may be more optimal for in-situ doping. The overall structure is independent of the growth process, provided that the Si material is effectively doped. This VLS process typically uses gold as a catalyst, but other materials such as copper or aluminum have been reported as successful catalysts. Thick Si wires typically have a 111 axial orientation, and in order to ensure good verticality normal to the substrate, 111-normal Si growth wafers may be used. The catalyst can be deposited on the substrate either as a continuous film that is heated and agglomerated to form discrete balls, deposited over a patterned oxide/shadow mask to control the placement of the agglomerated balls, or deposited as functionalized particles.

Following growth of the microwires, the catalyst balls are etched from the ends of the microwires, and the microwires are harvested from the substrate, through an reactive ion etch (RIE)-and-undercut process, sonication, or other means known in the art. The harvested microwires are then put in suspension and deposited onto a larger high-temperature-incompatible substrate (e.g., glass, metal, or plastic) using, for example, dielectrophoresis. The growth process uses doped silane, doped disilane, or doped chlorosilanes (e.g., $SiCl_4$) for the source material.

Figure 8:
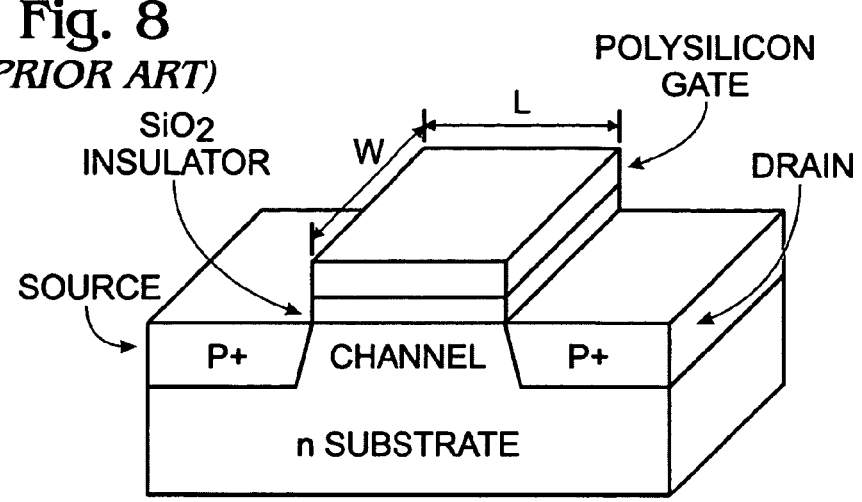
FIG. 8 depicts a conventional IC-based CMOS device on a bulk Si substrate (prior art).

FIG. 8 depicts a conventional IC-based CMOS device on a bulk Si substrate (prior art). As shown in FIGS. 6 and 7, as the microwires are grown, they are doped with alternating dopant concentrations and species, such that an example PMOS structure would have a heavily doped $P^+$ region (e.g., with boron as the dopant species), followed by an $N^-$ region (e.g., with a low concentration of phosphorous as the dopant), and then with another $P^+$ region. The basic doped microwire structure mimics the PMOS device of FIG. 8, where the substrate is lightly doped $N^-$ and the source and drain regions are highly-doped $P^+$.

Figure 9:
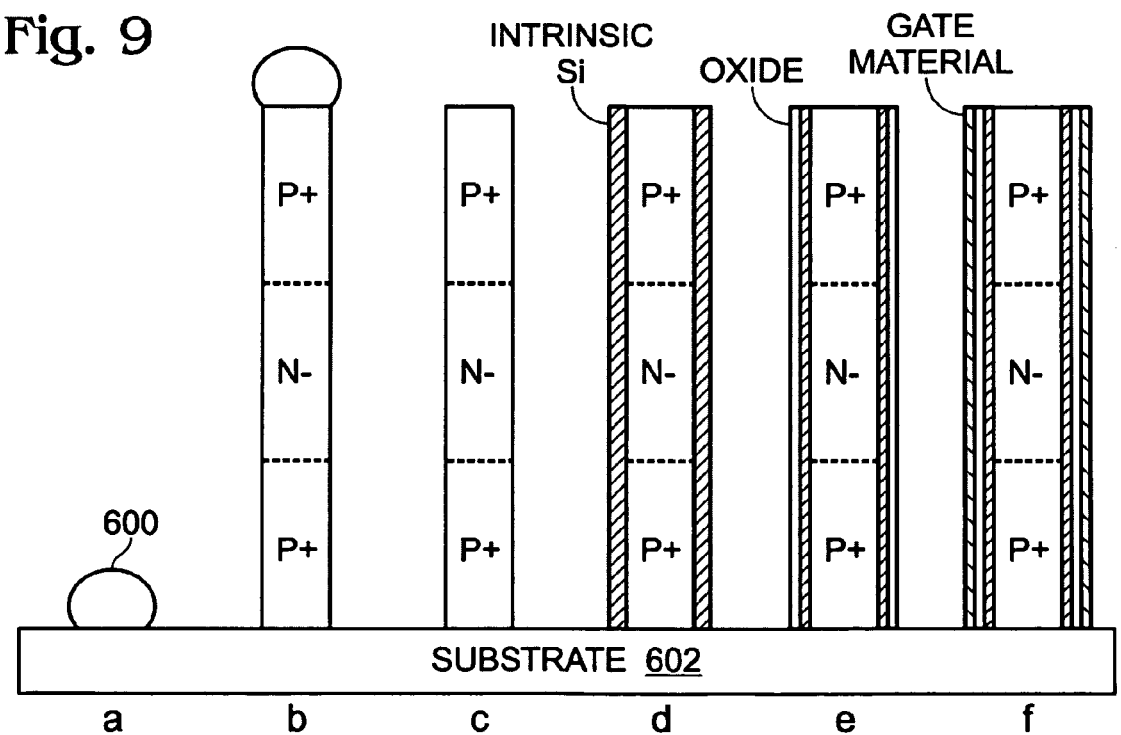
FIG. 9 depicts steps in the fabrication of an in-situ-doped microwire structure with shell layers of intrinsic Si, oxide, and conductive gate, based on a VLS-type growth process.

FIG. 9 depicts steps in the fabrication of an in-situ-doped microwire structure with shell layers of intrinsic Si, oxide, and conductive gate, based on a VLS-type growth process. The catalyst material 600 is formed on the substrate 602 and growth process is started (a). Dopant species are added during growth in such a way so as to have a sharp cut-off between the $P^+$ $N^-$ regions (b). The $N^-$ dopant species can be left on during the entire growth process (similar to a $P^+$ implant for PMOS devices fabricated on an $N^-$ substrate), see FIG. 6. This process allows for an abrupt transition region between the two adjacent areas, within the limits imposed by the materials and growth processes themselves (e.g., depletion of dopant from the catalyst).

After growth is completed, the catalyst ball is removed from the end of the microwire (c). This removal can be accomplished using a wet etch, provided that care is taken to avoid causing the microwires to stick to one another during the drying step (e.g., by using a critical-point-dryer). Example etches for a Au catalyst that do not affect the microwire itself might include $HCl/HNO_3$, $KI/I_2$, or NaCN.

Following catalyst removal, the wire is cleaned and an intrinsic Si layer is deposited over the surface of the wire to form a cylindrical shell (d). A perfect epitaxial silicon provides a defect-free material for the channel portion of the microwire device (see FIG. 2). The thickness of the epitaxial Si layer should be sufficient to provide a 30 to 90 nm-thick channel, and after thermal oxidation (e), a 10 to 60 nm-thick gate insulator layer is formed. Depending on the conditions used for the thermal oxidation, there might be significant dopant diffusion from the as-grown microwire into the intrinsic epi-Si layer. The oxidation process conditions can be tailored so that diffusion from the lightly-doped well region is avoided. For example, a heavier dopant species such as As can be used that does not diffuse as readily as lighter elements. As another example, a low temperature high density plasma (HDP) or wet oxidation process can be used to limit diffusion. After oxidation of the epi-Si layer, a final conductive gate shell is deposited onto the microwire (f). The gate material can be any conductive layer that has an appropriate work function for device operation (e.g., $P^+$ Si, WN, or TaAlN). After the final shell is deposited, the wires are harvested and put into suspension with a compatible fluid.

Note: the microwire of FIGS. 1A and 1B may be made in a similar manner, except that the step (Step d) of forming an intrinsic Si layer is omitted.

Figure 10:
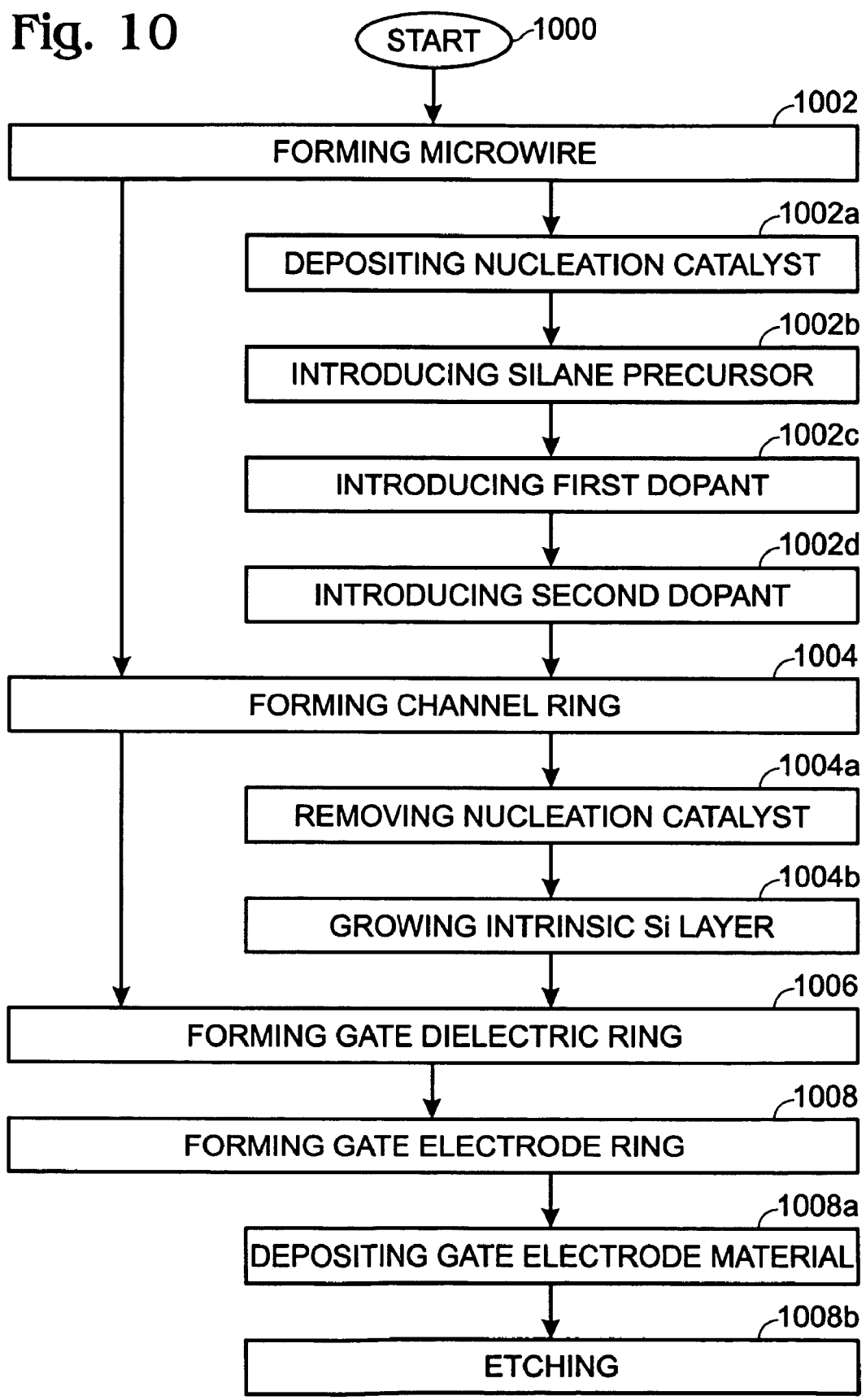
FIG. 10 is a flowchart illustrating a method for the fabrication of a well-structure anti-punch-through microwire device.

FIG. 10 is a flowchart illustrating a method for the fabrication of a well-structure anti-punch-through microwire device. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. The method starts at Step 1000.

Step 1002 forms a microwire with alternating highly and lightly doped cylindrical regions (e.g., PNP or NPN sequences). As noted above, the microwire may have a diameter of greater than 500 nm, however the design is suitable for smaller nanowires (i.e. nanowires) having a diameter of greater than 50 nm. Step 1004 forms a channel ring surrounding a first dopant well-structure region in the microwire, between source and drain regions of the microwire having a second dopant, opposite to the first dopant. Step 1006 forms a gate dielectric ring surrounding the channel ring. Step 1008 forms a gate electrode ring surrounding the gate dielectric ring. In one aspect, forming the microwire in Step 1002 includes forming a microwire with an outer shell wall, and forming the channel ring in Step 1004 includes forming a channel ring external to the microwire outer shell wall.

Typically, the channel ring is formed from an intrinsic silicon layer having a dopant concentration of less than about $2 \times 10^{16}$ per cubic centimeter ($cm^{-3}$), overlying a well-structure region having a first dopant concentration of greater than about $5 \times 10^{16}$ $cm^{-3}$.

Regardless of whether the channel ring is formed internal or external to the microwire, the channel typically has a ring thickness in the range of 30 to 90 nm. The gate dielectric ring typically has a ring thickness in the range of 10 to 60 nm.

In one aspect, forming the microwire in Step 1002 includes substeps. Step 1002a deposits a nucleation catalyst on a substrate to grow the microwire. Step 1002b introduces a silane precursor. Step 1002c introduces the first dopant, and Step 1002d pulse modulates the introduction of the second dopant. Alternately, Step 1002c introduces the second dopant and Step 1002d pulse modulates the introduction of the first dopant. In another aspect, Step 1002c pulse modulates the introduction of the second dopant in a first modulation cycle, while Step 1002d pulse modulates the introduction of the first dopant in a second modulation cycle. As shown in FIG. 7, the first and second modulation cycles may be complementary (opposite). Alternately, the cycles may overlap, or there may be gaps of no dopant introduction between cycles.

In another aspect, forming the channel ring surrounding the first dopant well-structure region includes substeps. Subsequent to forming the nanowire, Step 1004a removes the nucleation catalyst, and Step 1004b epitaxially grows an intrinsic Si layer surrounding the microwire.

Forming the gate dielectric ring surrounding the channel ring in Step 1006 may include forming an oxidized Si layer overlying the intrinsic Si. For example, wet thermal oxidation, dry thermal oxidation, or a high density plasma (HDP) process may be used to oxidize the intrinsic Si. Alternately, a chemical vapor deposition (CVD) process may be used to deposit oxidized Si overlying the intrinsic Si. Forming the gate electrode ring surrounding the gate dielectric ring may include substeps. Step 1008a deposits a gate electrode material overlying the oxidized intrinsic Si. Step 1008b selectively etches the gate electrode material, oxidized intrinsic Si, and intrinsic Si layer surrounding the source and drain regions.

A well-structure microwire transistor device has been provided. Examples of particular structural details, dimensions, and processes have been presented to illustrate the invention. However, the invention is not limited to merely these examples. Other variations and embodiments of the invention will occur to those skilled in the art.

I claim:

1. A method for the fabrication of a well-structure anti-punch-through microwire device, the method comprising:
    forming a microwire of lightly first doped cylindrical regions alternating with highly second doped cylindrical regions, where the first dopant is selected from a group consisting of n and p-type dopants, and the first dopant is opposite to the second dopant;
    forming a channel ring surrounding a well-structure region in the microwire having the first dopant, between source and drain regions of the microwire having the second dopant;
    forming a gate dielectric ring surrounding the channel ring; and,
    forming a gate electrode ring surrounding the gate dielectric ring.

2. The method of claim 1 wherein forming the microwire includes forming a microwire with an outer shell wall; and,
    wherein forming the channel ring includes forming a channel ring external to the microwire outer shell wall.

3. The method of claim 1 wherein forming the channel ring overlying the first dopant well-structure region in the microwire includes forming an intrinsic silicon (Si) layer having a dopant concentration of less than about $2 \times 10^{16}$ per cubic centimeter ($cm^{-3}$), overlying a well-structure region having a first dopant concentration of greater than about $5 \times 10^{16}$ $cm^{-3}$.

4. The method of claim 1 wherein forming the microwire includes forming a microwire having a diameter of greater than 500 nanometers (nm).

5. The method of claim 1 wherein forming the microwire includes forming a microwire having a diameter of greater than 50 nm.

6. The method of claim 1 wherein forming the channel ring overlying the first dopant well-structure region in the microwire includes forming a channel having a ring thickness in a range of 30 to 90 nanometers (nm).

7. The method of claim 1 wherein forming the microwire includes:
    depositing a nucleation catalyst on a substrate to grow the microwire;
    introducing a silane precursor;
    introducing the first dopant; and,
    pulse modulating the introduction of the second dopant.

8. The method of claim 1 wherein forming the microwire includes:
    depositing a nucleation catalyst on a substrate;
    introducing a silane precursor;
    pulse modulating the introduction of the second dopant in a first modulation cycle; and, pulse modulating the introduction of the first dopant in a second modulation cycle.

9. The method of claim 1 wherein forming the channel ring surrounding the first dopant well-structure region in the microwire includes:

subsequent to forming the nanowire, removing a nucleation catalyst; and, epitaxially growing an intrinsic Si layer surrounding the microwire.

10. The method of claim 7 wherein forming the gate dielectric ring surrounding the channel ring includes forming an oxidized Si layer overlying the intrinsic Si; and wherein forming the gate electrode ring surrounding the gate dielectric ring includes:

depositing a gate electrode material overlying the oxidized intrinsic Si; and, selectively etching the gate electrode material, oxidized intrinsic Si, and intrinsic Si layer surrounding the source and drain regions.

11. The method of claim 10 wherein forming the oxidized Si includes using a process selected from a group consisting of wet thermal oxidation of the intrinsic Si, dry thermal oxidation of the intrinsic Si, high density plasma (HDP) oxidation of the intrinsic Si, and chemical vapor deposition (CVD) of the oxidized Si overlying the intrinsic Si.

12. The method of claim 1 wherein forming the microwire with alternating highly and lightly doped cylindrical regions includes forming a microwire with a doped cylindrical sequence selected from a group consisting of NPN and PNP.

13. The method of claim 1 wherein forming the gate dielectric ring overlying the channel ring includes forming a gate dielectric ring having a ring thickness in a range of 10 to 60 nm.

* * * * *